(12) United States Patent
Niu et al.

(10) Patent No.: US 9,768,146 B2
(45) Date of Patent: Sep. 19, 2017

(54) BATTERY PROTECTION PACKAGE AND PROCESS OF MAKING THE SAME

(71) Applicant: Alpha and Omega Semiconductor Incorporated, Sunnyvale, CA (US)

(72) Inventors: Zhiqiang Niu, Santa Clara, CA (US); Yan Xun Xue, Los Gatos, CA (US); Man Sheng Hu, San Francisco, CA (US); Jun Lu, San Jose, CA (US); Yueh-Se Ho, Sunnyvale, CA (US); Hamza Yilmaz, Gilroy, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/387,630

(22) Filed: Dec. 21, 2016

(65) Prior Publication Data

US 2017/0098626 A1    Apr. 6, 2017

Related U.S. Application Data

(62) Division of application No. 14/814,316, filed on Jul. 30, 2015, now Pat. No. 9,564,406.

(51) Int. Cl.
*H01L 25/065* (2006.01)
*H01L 23/00* (2006.01)
(Continued)

(52) U.S. Cl.
CPC ........ *H01L 25/0652* (2013.01); *H01L 21/304* (2013.01); *H01L 21/4825* (2013.01);
(Continued)

(58) Field of Classification Search
CPC .. H01L 23/293; H01L 21/31116; H01L 25/50; H01L 22/34; H01L 24/11;
(Continued)

(56) References Cited

U.S. PATENT DOCUMENTS

| 2009/0008758 A1* | 1/2009 | Lu ................... H01L 21/823487 257/676 |
| 2012/0104580 A1* | 5/2012 | Feng .................... H01L 21/561 257/673 |

(Continued)

*Primary Examiner* — Latanya N Crawford
(74) *Attorney, Agent, or Firm* — Chen-Chi Lin

(57) ABSTRACT

The present invention discloses small-size battery protection packages and provides a process of fabricating small-size battery protection packages. A battery protection package includes a first common-drain metal oxide semiconductor field effect transistor (MOSFET), a second common-drain MOSFET, a power control integrated circuit (IC), a plurality of solder balls, a plurality of conductive bumps, and a packaging layer. The power control IC is vertically stacked on top of the first and second common-drain MOSFETs. At least a majority portion of the power control IC and at least majority portions of the plurality of solder balls are embedded into the packaging layer. The process of fabricating battery protection packages includes steps of fabricating power control ICs; fabricating common-drain MOSFET wafer; integrating the power control ICs with the common-drain MOSFET wafer and connecting pinouts; forming a packaging layer; applying grinding processes; forming a metal layer; and singulating battery protection packages.

9 Claims, 18 Drawing Sheets

(51) Int. Cl.
*H01L 21/304* (2006.01)
*H01L 21/78* (2006.01)
*H01L 21/56* (2006.01)
*H01L 25/00* (2006.01)
*H01L 23/31* (2006.01)
*H01L 23/544* (2006.01)
*H01L 21/66* (2006.01)
*H01L 21/48* (2006.01)
*H01L 23/495* (2006.01)
*H02J 7/00* (2006.01)

(52) U.S. Cl.
CPC ............ *H01L 21/565* (2013.01); *H01L 21/78* (2013.01); *H01L 22/14* (2013.01); *H01L 23/3114* (2013.01); *H01L 23/49513* (2013.01); *H01L 23/49562* (2013.01); *H01L 23/49575* (2013.01); *H01L 23/544* (2013.01); *H01L 24/11* (2013.01); *H01L 25/50* (2013.01); *H02J 7/0029* (2013.01); *H01L 2223/5446* (2013.01); *H01L 2224/11318* (2013.01); *H01L 2224/11849* (2013.01); *H01L 2225/06513* (2013.01); *H01L 2225/06555* (2013.01); *H01L 2225/06582* (2013.01); *H01L 2924/13091* (2013.01); *H02J 2007/0039* (2013.01)

(58) Field of Classification Search
CPC ..... H01L 24/03; H01L 23/544; H01L 21/304; H01L 23/3171; H01L 23/4951; H01L 25/0652; H01L 24/89; H01L 23/49575; H01L 21/563; H01L 21/683; H01L 23/62
See application file for complete search history.

(56) References Cited

U.S. PATENT DOCUMENTS

| | | | |
|---|---|---|---|
| 2014/0242756 A1 | 8/2014 | Xue et al. | |
| 2014/0315350 A1 | 10/2014 | Xue et al. | |
| 2015/0056752 A1* | 2/2015 | Feng | H01L 21/561 438/113 |
| 2016/0164146 A1* | 6/2016 | Na | H01M 2/30 429/7 |
| 2017/0092529 A1* | 3/2017 | Han | H01L 21/6836 |

* cited by examiner

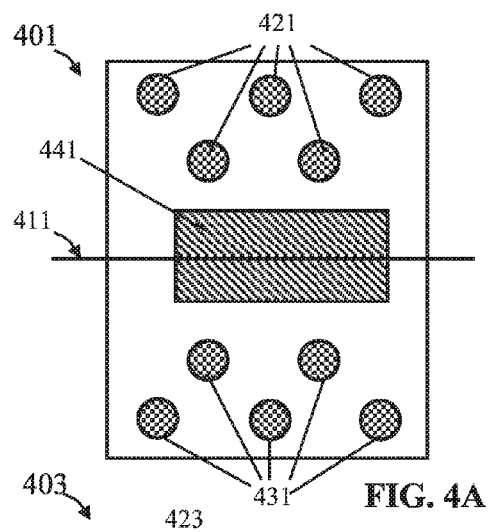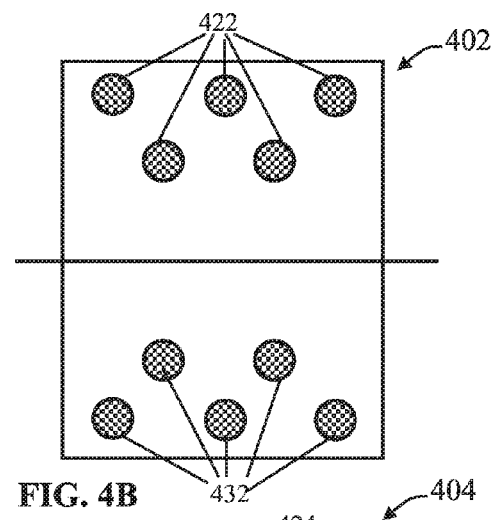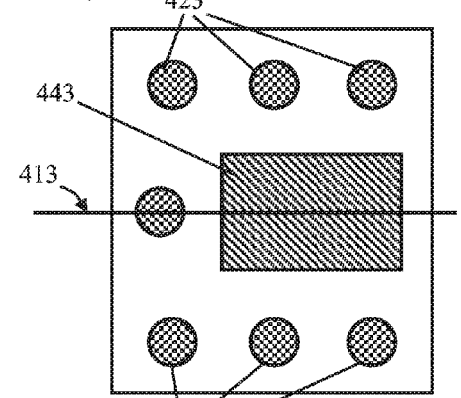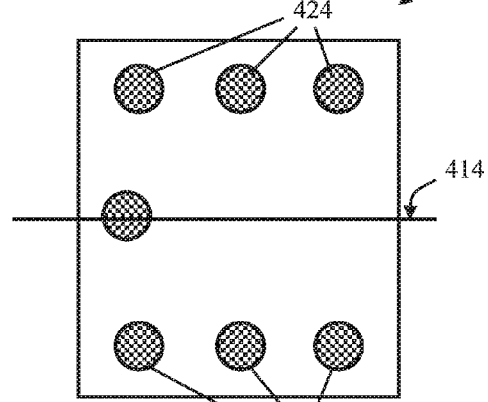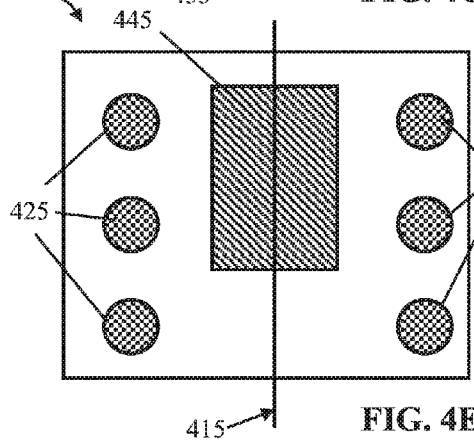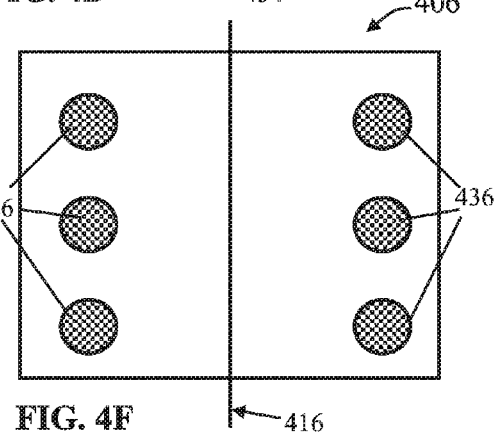

BATTERY PROTECTION PACKAGE AND PROCESS OF MAKING THE SAME

CROSS-REFERENCE TO RELATED APPLICATIONS AND INCORPORATION BY REFERENCE

This Patent Application is a Divisional Application of a pending application Ser. No. 14/814,316 filed on Jul. 30, 2015. The Disclosure made in the patent application Ser. No. 14/814,316 is hereby incorporated by reference. U.S. Patent Application Publication 2014/0242756 to Xue et al. and U.S. Patent Application Publication 2014/0315350 to Xue et al. are hereby incorporated by reference.

FIELD OF THE INVENTION

This invention relates generally to stacked-die package for battery power management. More particularly, the present invention relates to smaller and thinner battery protection packages and a process of fabricating the packages.

BACKGROUND OF THE INVENTION

A battery pack of a mobile electronic device may include a battery protection circuit module (PCM), cells, and a terminal line. The battery protection circuit module of a battery protection package controls the charge and discharge of the cells. The battery protection package offers over-voltage and over-current protection. Conventional technologies to further reduce the size of battery protection integrated circuit (IC) are challenged by several technical difficulties and limitations. Conventional battery protection IC typically includes a power control IC and interconnected dual common-drain metal oxide semiconductor field effect transistors (MOSFETs), which are co-packed in a lead frame package with a small foot print of a size as small as 2 mm×4 mm. Furthermore, wire bonding is conventionally used for the interconnection in a semiconductor device package. However, such interconnection mode results in a high loop of the bonding wire of the clip. Thus, the requirements of obtaining a thinner device cannot be met. In one example, the size of a conventional battery protection package is 2 mm×4 mm×0.65 mm.

SUMMARY OF THE INVENTION

The present invention discloses small-size battery protection packages and provides a process of fabricating the battery protection packages. In examples of the present disclosure, a battery protection package includes a first common-drain metal oxide semiconductor field effect transistor (MOSFET), a second common-drain MOSFET, a power control integrated circuit (IC), a plurality of solder balls, a plurality of conductive bumps, and a packaging layer. The power control IC is vertically stacked on top of the first and second common-drain MOSFETs. At least a majority portion of the power control IC and at least majority portions of the plurality of solder balls are embedded into the packaging layer. In examples of the present disclosure, the process of fabricating battery protection packages includes steps of fabricating power control ICs; fabricating common-drain MOSFET wafer; integrating the power control ICs with the common-drain MOSFET wafer and connecting pinouts; forming a packaging layer; applying grinding processes; forming a metal layer; and singulating battery protection packages.

The thickness of a battery protection package is reduced by replacing bonding wires with stacking a thin power control IC on thin MOSFETs. The drain-source on resistance is reduced and the power consumption is reduced with reduced silicon substrates, with reduced power control IC die sizes, and with increased MOSFET die sizes.

BRIEF DESCRIPTION OF THE DRAWINGS

FIG. 4A-FIG. 4F are top views of layout designs of battery protection packages in examples of the present disclosure.

DETAILED DESCRIPTION OF THE INVENTION

The present invention disclosed a low profile battery protection package with reduced thermal resistance, with reduced drain-source on resistance, and with reduced power consumption.

Figure 1A:
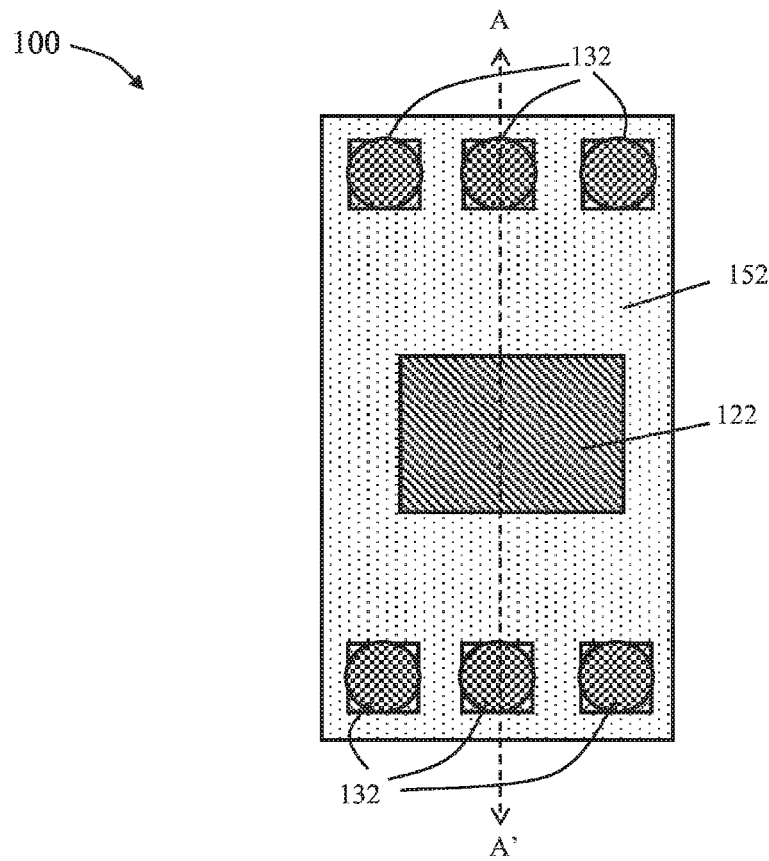
FIG. 1A is a top view and FIG. 1B is a cross-sectional view of a battery protection package in examples of the present disclosure.
Figure 1B:
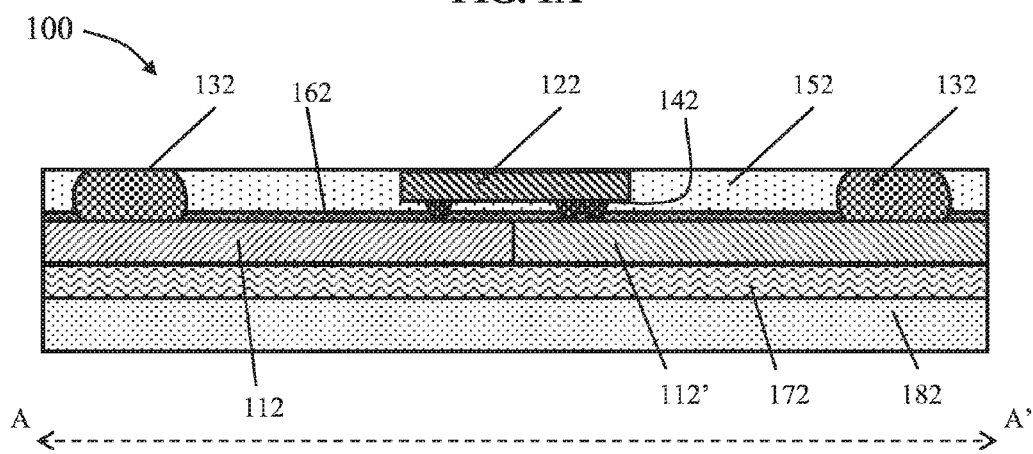

FIG. 1A is a top view of a battery protection package 100 and FIG. 1B is a cross-sectional view of the battery protection package 100 along a line AA' in an example of the present disclosure. The battery protection package 100 comprises first and second common-drain MOSFETs 112 and 112' having a group of bonding pads (not shown) on its top surface with a plurality of solder balls 132 formed on the plurality of bonding pads, a power control IC 122 having a plurality of conductive bumps 142 formed on its top surface (flipped chip), a packaging layer 152, a thick metal layer 172 deposited on the bottom surface of the dual common-drain MOSFETs 112 and 112', and a backside molded layer 182 attached to the bottom surface of the thick metal layer 172. The power control IC 122 is flipped and vertically stacked on top of the first and second common-drain MOSFETs 112 and 112'. The plurality of conductive bumps 142 of the power control IC are attached to another group of bonding pads on the first and second common-drain MOSFETs 112 and 112'. The packaging layer 152 partially encapsulated the power control IC 122 and the solder balls 132 with the bottom surface of the power control IC 122 and the top surfaces of the solder balls 132 exposed. The power control IC 122 is electrically coupled to the first common-drain MOSFET 112 and the second common-drain MOSFET via the plurality of conductive bumps 142.

The battery protection package 100 further comprises a passivation layer 162 having the openings exposing the bonding pads on top surfaces of the first and second common-drain MOSFETs 112 and 112'. The passivation layers may contain polyimide.

A thick metal layer 172, which generally includes Ti/Ni/Ag with a thickness of Ag layer being about 5 to 10 microns, is deposited on the bottom surfaces of the first and second common-drain MOSFETs 112 and 112'. The backside molded layer 182, or a LC tape, is formed at the bottom of thick metal layer 172 with the thickness of the backside molded layer 182 being about 100 microns. Laser-cutting tapes may be attached to the backside molded layer 182.

In examples of the present disclosure, the packaging layer 152 and the backside molded layer 182 contain epoxy resin.

Figure 2A:
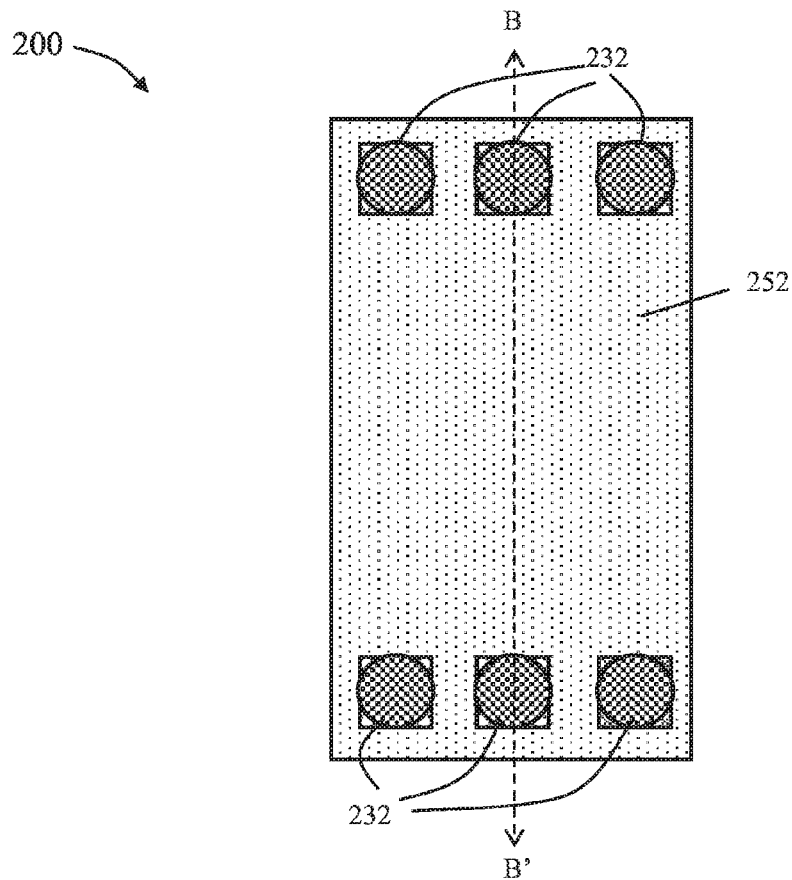
FIG. 2A is a top view and FIG. 2B is a cross-sectional view of another battery protection package in examples of the present disclosure.
Figure 2B:
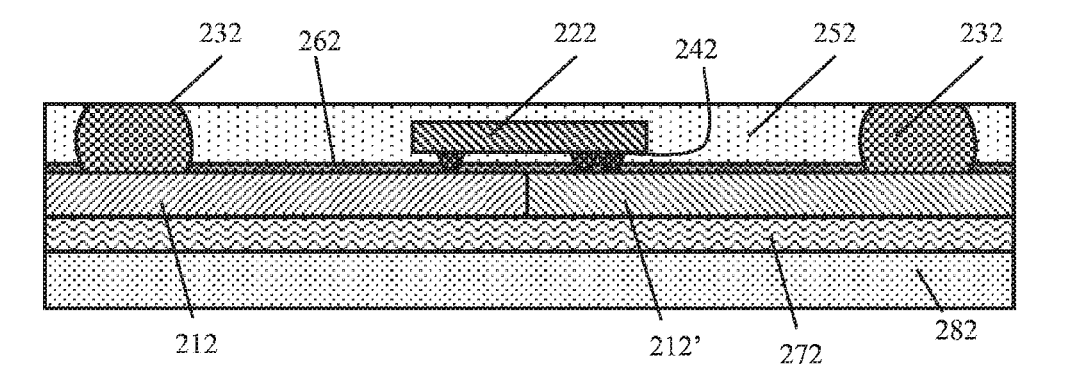

FIG. 2A is a top view of a battery protection package 200 and FIG. 2B is a cross-sectional view of the battery protection package 200 along a line BB' in another example of the present disclosure. The battery protection package 200 comprises first and second common-drain MOSFETs 212 and 212' having a group of bonding pads (not shown) at the top surfaces with a plurality of solder balls 232 formed on the plurality of bonding pads, a power control IC 222 having a plurality of conductive bumps 242 formed on the top surface, a packaging layer 252 encapsulating the power control IC 222 and the solder balls 232, a thick metal layer 272 deposited on the bottom surface of the dual common-drain MOSFETs 212 and 212', and a backside molded layer 282 attached to the bottom surface of the thick metal layer 272. The power control IC 222 is flipped and vertically stacked on top of the first and second common-drain MOSFETs 212 and 212', in which the plurality of conductive bumps 242 of the power control IC 222 are attached and electrically connected to another group of bonding pads on the first and second common-drain MOSFETs 212 and 212'. In examples of the present disclosure, the power control IC 222 is completely encapsulated by the packaging layer 252 while the top surfaces of the solder balls 232 is exposed from the top surface of the packaging layer 252.

The battery protection package 200 also comprises a passivation layer 262 having the openings exposing the bonding pads on top surfaces of the first and second common-drain MOSFETs 212 and 212'. The passivation layers may contain polyimide.

In examples of the present disclosure, a thick metal layer 272, which generally includes Ti/Ni/Ag with a thickness of Ag layer being about 5 to 10 microns, is deposited on the bottom surfaces of the first and second common-drain MOSFETs 212 and 212'. The backside molded layer 282 is formed at the bottom of thick metal layer 272 with the thickness of the backside molded layer 282 being about 100 microns. Laser-cutting tapes may be attached to the backside molded layer 282. The overall thickness of the battery protection packages 100 and 200 is about 0.35 mm compared with a thickness of 0.65 mm of a conventional battery protection package.

Figure 3A:
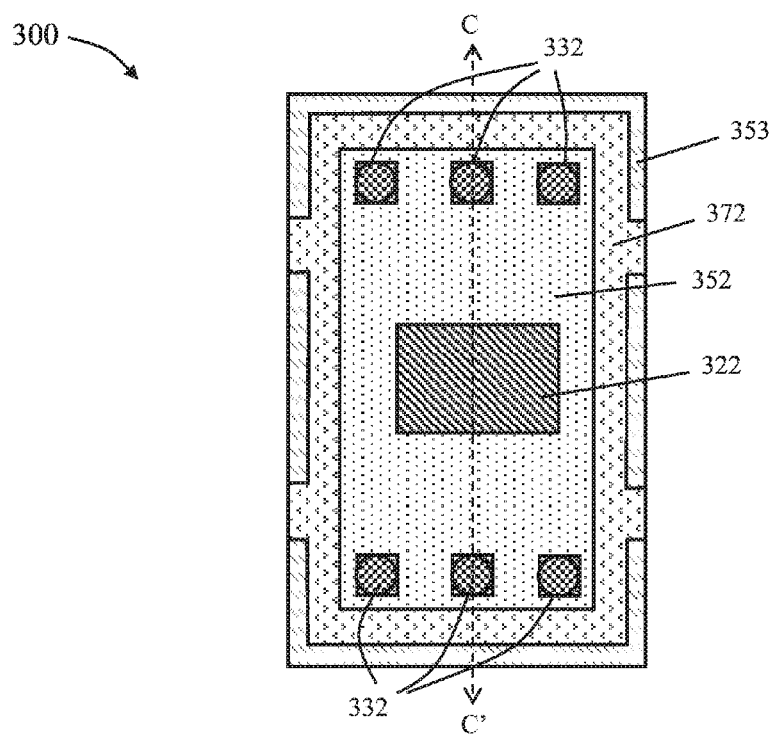
FIG. 3A is a top view and FIG. 3B is a cross-sectional view of still another battery protection package in examples of the present disclosure.
Figure 3B:
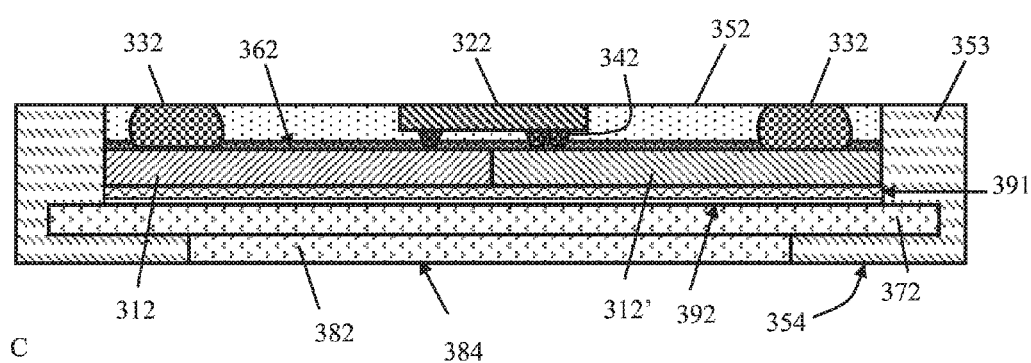

FIG. 3A is a top view of still another battery protection package 300 and FIG. 3B is a cross-sectional view of the battery protection package 300 along a line CC' in an example of the present disclosure. The top portion of the packaging layer 353 in FIG. 3A is transparent to show a portion of the die paddle 372 of the battery protection package 300. The battery protection package 300 comprises first and second common-drain MOSFETs 312 and 312'. A metal layer 391, which generally includes Ti/Ni/Ag with a thickness of Ag layer being about 1 micron, is deposited on the bottom surfaces of the first and second common-drain MOSFETs 312 and 312'; first and second common-drain MOSFETs 312 and 312' with deposited metal layer 391 is attached to a die paddle 372 of a lead frame 382 via silver epoxy 392. A plurality of bonding pads (not shown) is attached to the top surfaces of the first and second common-drain MOSFETs 312 and 312'. A plurality of solder balls 332 is formed on a group of bonding pads. The battery protection package 300 further comprises a power control IC 322 flipped and vertically stacked on top of the first and second common-drain MOSFETs 312 and 312'. A plurality of conductive bumps 342 formed on the top surface of the power control IC 322. A first packaging layer 352 partially encapsulated the power control IC 322 and the solder balls 332 with the back surface of the power control IC 322 (flipped chip) and the top surfaces of the solder balls 132 exposed from the top surface of the first packaging layer 352. The battery protection package 300 further comprises a passivation layer 362 and an RDL layer (not shown), which optionally is formed by a double metal deposit, formed on top surface of the first and second common-drain MOSFETs 312 and 312'. The power control IC 322 is electrically coupled to the first and second common-drain MOSFETs 312 and 312' via the plurality of conductive bumps 342 connecting to another group of bonding pads on the first and second common-drain MOSFETs 312 and 312'.

In examples of the present disclosure, the plurality of conductive bumps 342 may be made of gold, silver, or copper. The lead frame 382 may be made of copper.

The first common-drain MOSFET 312 and the second common-drain MOSFET 312' are attached to the top surface of the die paddle 372 of the lead frame 382 via silver epoxy 392. The lead frame 382 is half etched at the bottom surface for mold locking. In examples of the present disclosure, external second packaging layer 353 encapsulates the packaging layer 352, the first and second common-drain MOSFETs 312 and 312'the metal layer 391, the die paddle 372, and the lead frame 382. The bottom surface 384 of the lead frame 382 is exposed from the bottom surface 354 of the second packaging layer 353.

Figure 3C:
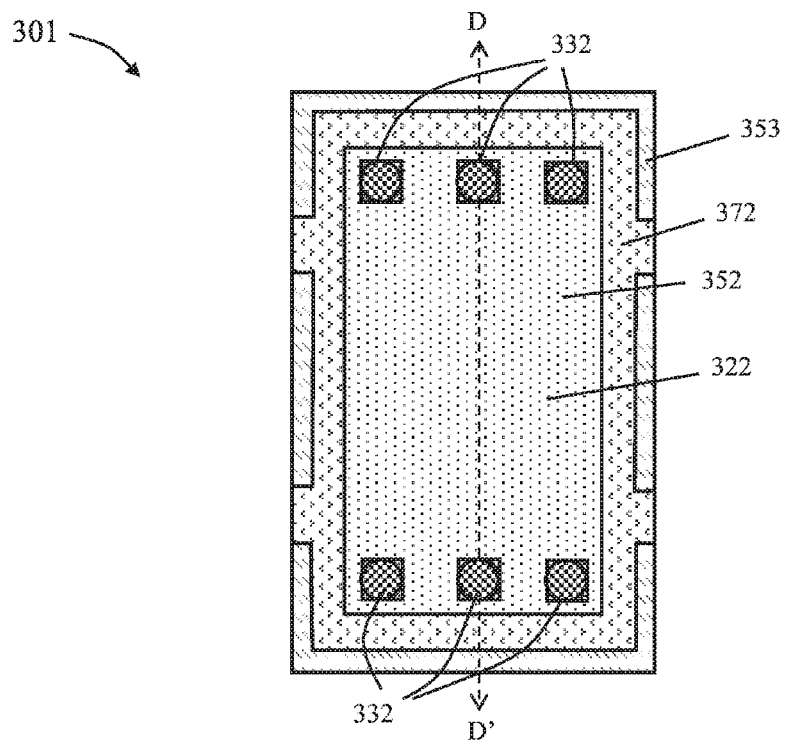
FIG. 3C is a top view and FIG. 3D is a cross-sectional view of yet another battery protection package in examples of the present disclosure.
Figure 3D:
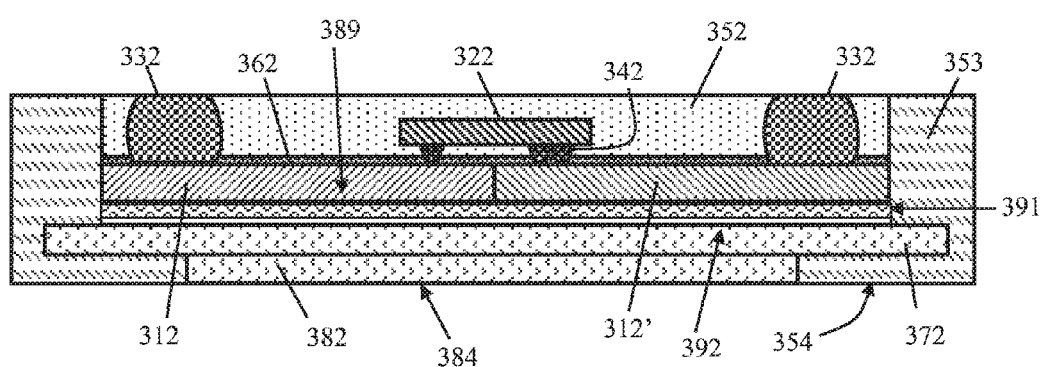

FIG. 3C and FIG. 3D shows a battery protection package 301, similar as the battery protection package 300 of FIG.

3A and FIG. 3B. For the battery protection package 301, the power control IC 322 is completely encapsulated by the first packaging layer 352 while the top surfaces of the solder balls 332 is exposed from the top surface of the first packaging layer 352.

FIG. 4A-FIG. 4F are top views of different layout designs of battery protection packages 401-406 in examples of the present disclosure. Pinouts 421-426 and pinouts 431-436 may be exposed solder balls, for example solder balls 132, 232 or 332 of FIG. 1A, FIG. 2A, FIG. 3A, and FIG. 3C. The thermal resistance of the battery protection package is reduced when the surface areas and the number of the pinouts 421-426 and the pinouts 431-436 are increased. The drain-source on resistance, Rds(on), and the power consumption are reduced when the thickness of the silicon wafers, for example, the thickness of the MOSFETs, and the thickness of the power control IC dies, are reduced. Furthermore, Rds(on) and the power consumption are reduced when the size of the power control IC die are reduced, and top surface areas of the MOSFETs are increased. As shown in FIGS. 4A, 4C and 4E, the backside of the flipped power control ICs 441, 443, and 445 of the battery protection packages 401, 403, and 405 are exposed, while the power control ICs of the battery protection packages 402, 404, and 406 are completely encapsulated inside the packages. Each of the battery protection packages 401-406 is of rectangular shape and the pinouts at two opposite edges at the top surface are symmetric with respect to a reflectional symmetry line, for example the symmetry lines 411-416. For example, In FIG. 4A, the pinouts 421 and the pinouts 431 are symmetric with respect to the reflectional symmetry lines 411. In FIG. 4B, the pinouts 422 and the pinouts 432 are symmetric with respect to the reflectional symmetry lines 412. In FIG. 4C, the pinouts 423 and the pinouts 433 are symmetric with respect to the reflectional symmetry lines 413. An additional test-only pinout 453 is located on the reflectional symmetry line 413. In FIG. 4D, the pinouts 424 and the pinouts 434 are symmetric with respect to the reflectional symmetry line 414, and an additional test-only pinout 454 is located on the reflectional symmetry line 414. In FIG. 4E, the pinouts 425 and the pinouts 435 are symmetric with respect to the reflectional symmetry line 415. In FIG. 4F, the pinouts 426 and the pinouts 436 are symmetric with respect to the reflectional symmetry line 416.

Figure 5A:
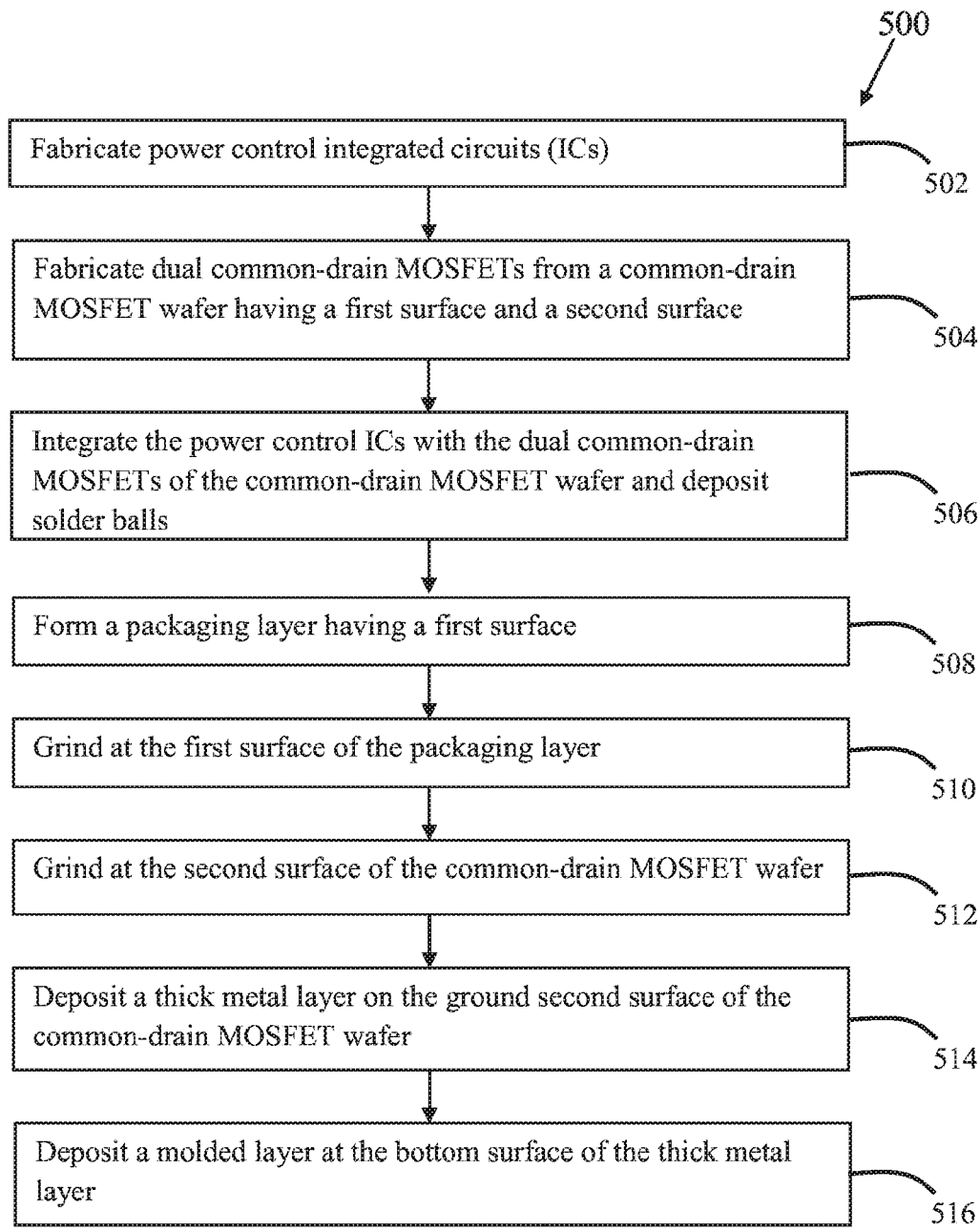
FIG. 5A and FIG. 5B are flowcharts of two processes to fabricate two different battery protection packages in examples of the present disclosure.

FIG. 5A is a flowchart of a process 500 to fabricate the battery protection packages 100 and 200 in FIG. 1B and FIG. 2B. Process 500 may begin in block 502.

Figure 6:
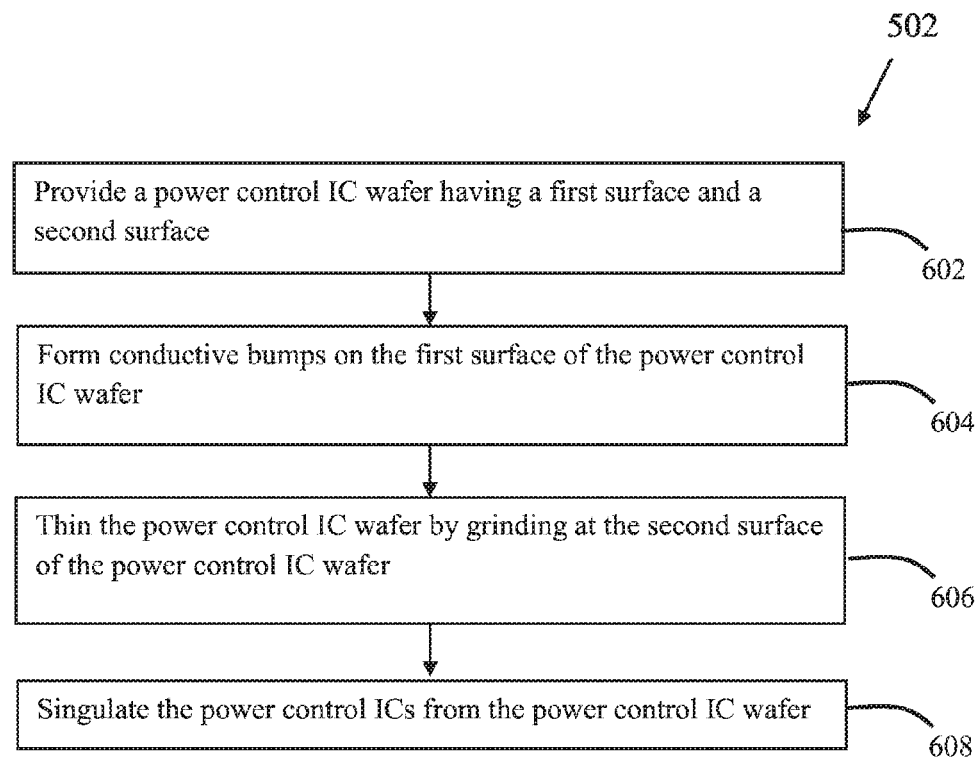
FIG. 6 is a flowchart of a process to fabricate power control integrated circuits (ICs) in examples of the present disclosure.
Figure 11A:
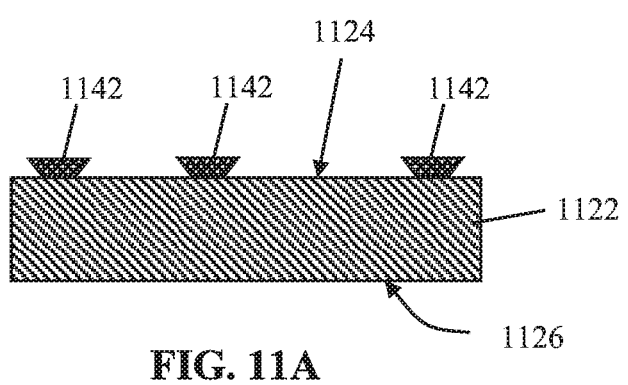
FIG. 11A and FIG. 11B are a series of cross-sectional views showing various processing steps to fabricate power control ICs in examples of the present disclosure.
Figure 11B:

In block 502, power control ICs are fabricated from an IC wafer. FIG. 6 is a flowchart of a process of block 502 to fabricate power control integrated circuits (ICs) from an IC wafer in examples of the present disclosure. FIGS. 11A and 11B are cross-sectional diagrams showing one power control IC is fabricated in an example. The process of block 502 may begin in block 602.

In block 602 and FIG. 11A, a power control IC wafer 1122 including a plurality of power control IC dies (not shown) is provided. The power control IC wafer 1122 has a first surface 1124 and a second surface 1126. Block 602 may be followed by block 604.

In block 604 and FIG. 11A, conductive bumps 1142 are formed on the first surface 1124 of the power control IC wafer 1122. Block 604 may be followed by block 606.

In block 606 and FIG. 11A, a grinding process is applied at the second surface 1126 of the power control IC wafer 1122. FIG. 11B shows a thinner power control IC wafer 1128 after the grinding process. In examples of the present disclosure, the power control IC wafer 1122 of FIG. 11A is about 625 microns in thickness. In examples of the present disclosure, the thinner power control IC wafer 1128 of FIG. 11B is about 100 microns in thickness. Block 606 may be followed by block 608.

In block 608, individual power control ICs are singulated from the power control IC wafer.

Figure 7:
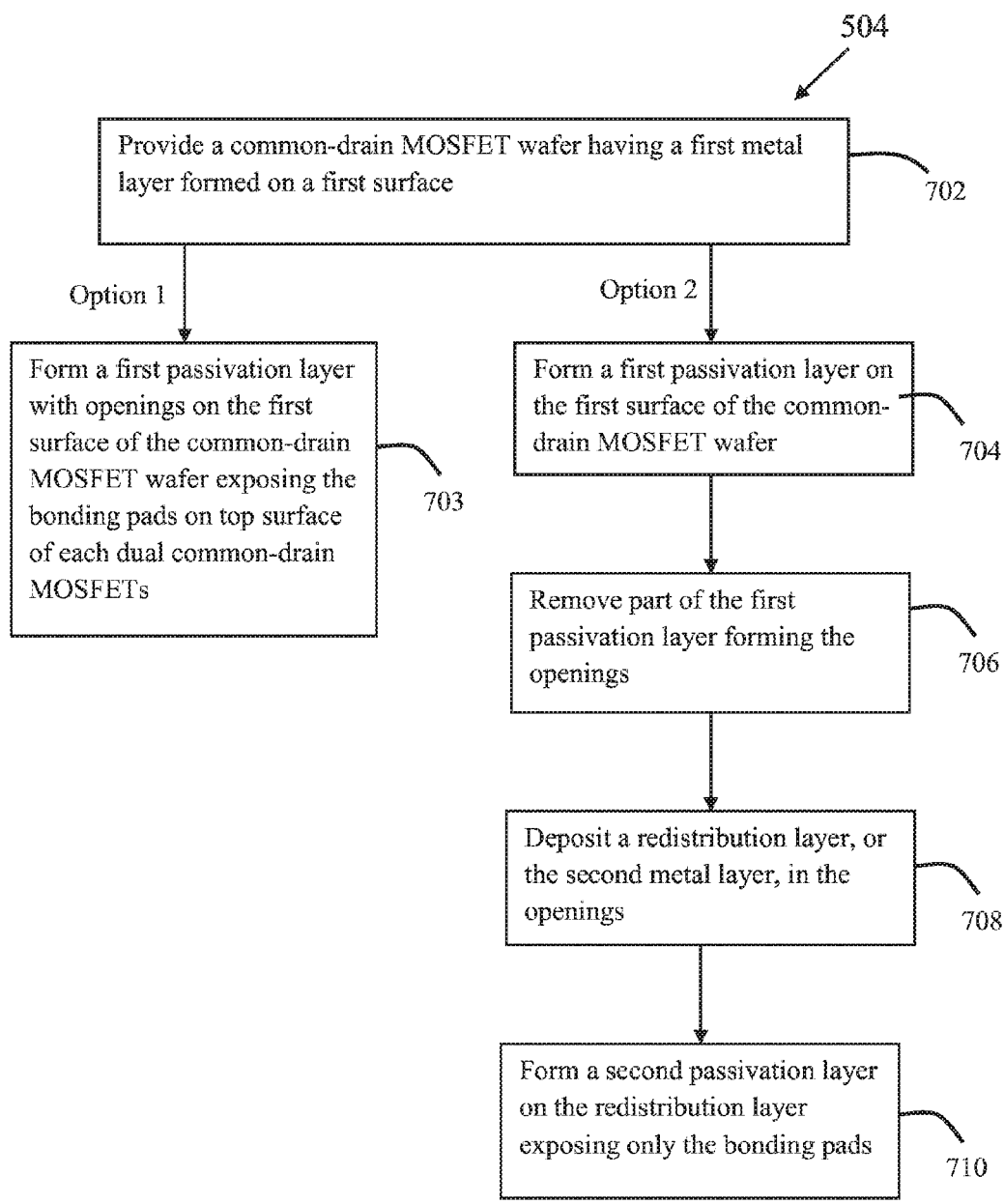
FIG. 7 is a flowchart of a process to fabricate common-drain MOSFETs from a common-drain MOSFET wafer in examples of the present disclosure.

Block 502 may be followed by block 504. In block 504, common-drain MOSFETs are fabricated from a common-drain MOSFET wafer. FIG. 7 is a flowchart of a process of block 504 to fabricate common-drain MOSFETs from a common-drain MOSFET wafer in examples of the present disclosure. The process of block 504 may begin in block 702. There are two options for the process of block 504.

The process of Option 1 begins in block 702. In block 702, a common-drain MOSFET wafer including a plurality of the dual common-drain MOSFETs is provided. The common-drain MOSFET wafer has a first metal layer deposited and patterned on a first surface. The patterned first metal layer may include a first gate electrode connected to a gate region of the first MOSFET, a first source electrode connected to a source region of the first MOSFET and second gate electrode connected to a second gate region of the second MOSFET and a second source electrode connected to a source region of the second MOSFET. Block 702 may be followed by block 703.

In block 703, a first passivation layer with openings is formed on the first surface of the common-drain MOSFET wafer exposing bonding pads on top surface of each dual common-drain MOSFETs. At least one opening is provided for each gate or source electrode of each MOSFET in the common-drain MOSFET wafer thus at least one bonding pad is provided for each gate or source electrode of each MOSFET on the first surface of the common-drain MOSFET wafer. A processed common-drain MOSFET wafer is formed.

The process of Option 2 begins in block 702. In block 702, a common-drain MOSFET wafer including a plurality of the dual common-drain MOSFETs provided. The common-drain MOSFET wafer has a first metal layer deposited and patterned on a first surface. The patterned first metal layer may include a first gate electrode connected to a gate region of the first MOSFET, a first source electrode connected to a source region of the first MOSFET and second gate electrode connected to a second gate region of the second MOSFET and a second source electrode connected to a source region of the second MOSFET. Block 702 may be followed by block 704.

In block 704, a first passivation layer is formed on the first surface of the common-drain MOSFET wafer. Block 704 may be followed by block 706.

In block 706, part of the first passivation layer is removed forming the openings to expose portions of the first metal layer. At least one opening is provided for each gate or source electrode of each MOSFET in the common-drain MOSFET wafer. Block 706 may be followed by block 708.

In block 708, a redistribution layer, or a second metal layer, is deposited over the first passivation layer and inside the openings of the first passivation layer on the top surface of the common-drain MOSFET wafer and then patterned to form the bonding pads and interconnections therebetween. Block 708 may be followed by block 710.

In block 710, a second passivation layer is formed on the redistribution layer exposing only the bonding pads. At least one bonding pad is provided for each gate or source electrode of each MOSFET on the first surface of the common-drain MOSFET wafer. Additional interconnecting bonding pads not connected to any gate or source electrode of the MOSFET may be provided by the redistribution layer through the openings of the second passivation layer. A processed common-drain MOSFET wafer is formed.

Block 504 may be followed by block 506.

Figure 8A:
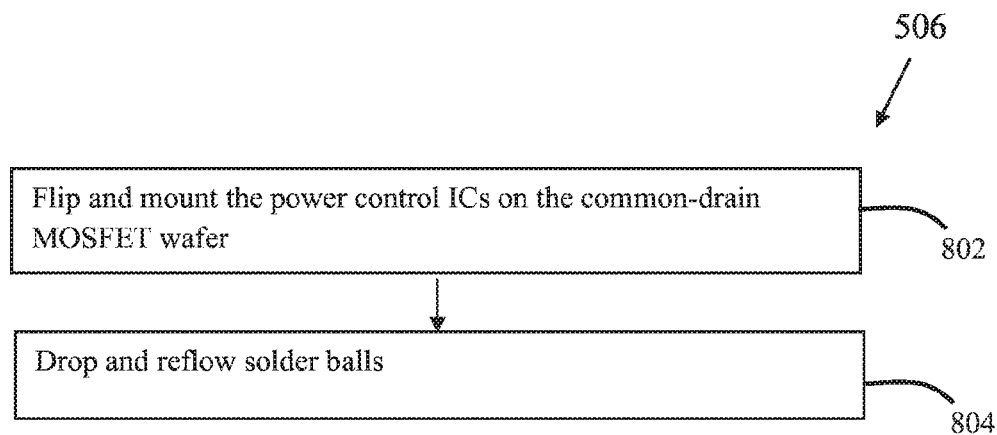
FIG. 8A and FIG. 8B are flowcharts of processes to connect the power control ICs with the common-drain MOSFET wafers and to connect pinouts in examples of the present disclosure.
Figure 8B:
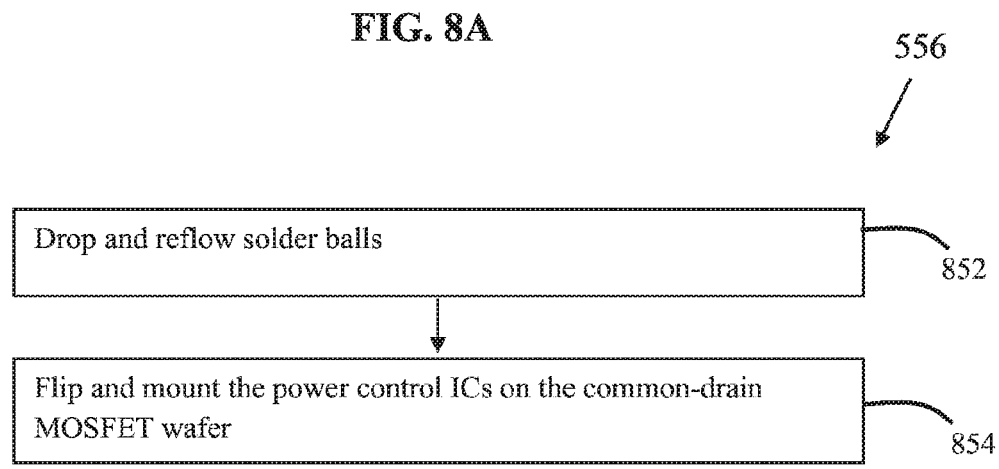

In block 506, the power control ICs are connected with the common-drain MOSFET wafer. Pinouts, or solder balls, are formed on a group of the bonding pads of the common-drain MOSFETs. In FIG. 8A and FIG. 8B, the two different processes to connect the power control ICs with the common-drain MOSFET wafer and to form the solder balls in block 506 are divided into sub-steps. FIG. 8A is a flowchart of a first process of block 506 to connect the power control ICs with the common-drain MOSFET wafer and to connect pinouts in examples of the present disclosure. The process of block 506 may begin in block 802. For the purpose of simplicity, cross-section diagrams of FIG. 13A and FIG. 13B only show one power control IC mounted on a dual common-drain MOSFETs of the processed common-drain MOSFET wafer.

Figure 13A:
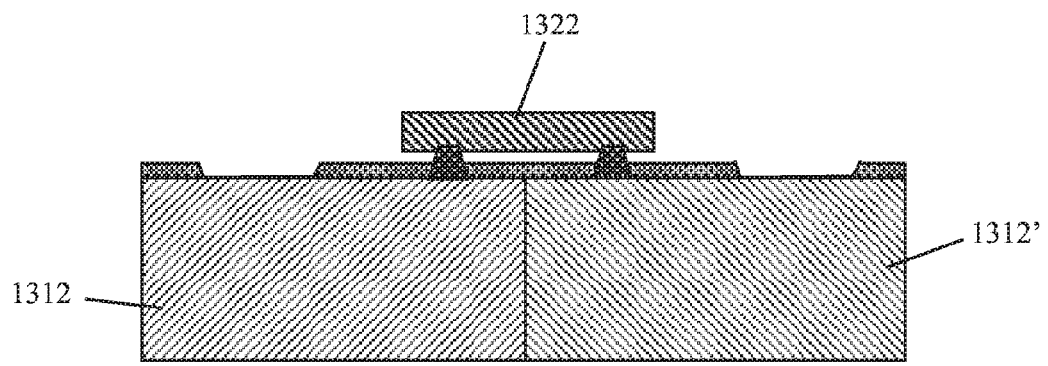
FIG. 13A and FIG. 13B are a series of cross-sectional views showing various processing steps to connect the power control ICs with the common-drain MOSFET wafers and to connect pinouts in examples of the present disclosure.

In block 802 and FIG. 13A, one power control IC 1322 is flipped and mounted on the dual common-drain MOSFETs 1312 and 1312'. The conductive bumps on the power control IC 1322 is electrically coupled to the gate electrodes of both MOSFETs 1312 and 1312' at the openings on the passivation layer. Block 802 may be followed by block 804.

Figure 13B:
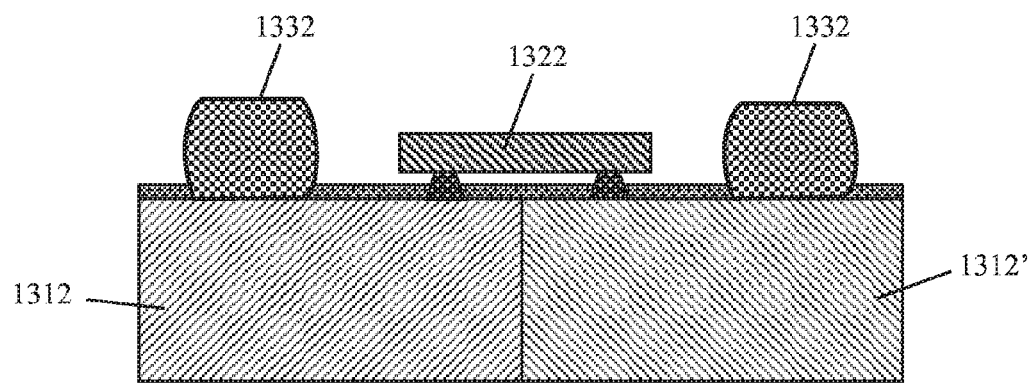

In block 804 and FIG. 13B, solder balls 1332 are dropped on bonding pads (not shown) at other openings on the passivation layer electrically connecting to the sources of the dual common-drain MOSFETs 1312 and 1312' with power control IC 1322 mounted thereon. A reflow process is applied to the solder balls 1332.

FIG. 8B is a flowchart of a process 556 to connect pinouts and to connect the power control ICs with the common-drain MOSFET wafer and in examples of the present disclosure. The process 556 may begin in block 852. For the purpose of simplicity, cross-section diagrams of FIG. 14A and FIG. 14B only show one power control IC mounted on a dual common-drain MOSFETs of the processed common-drain MOSFET wafer.

Figure 14A:
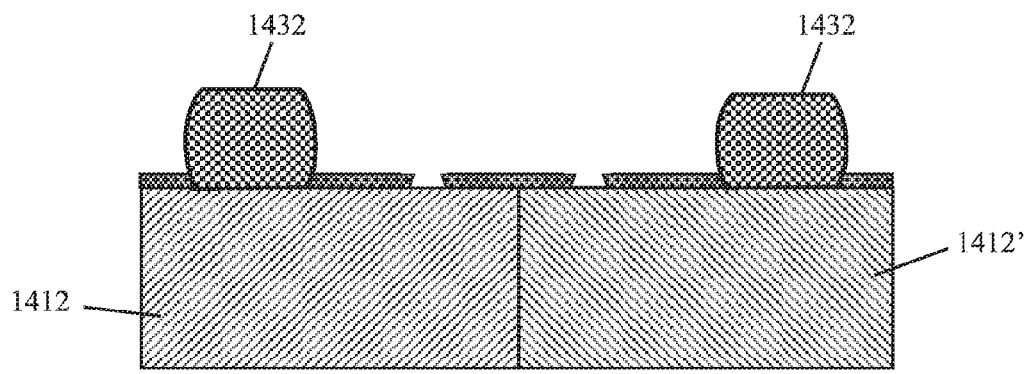
FIG. 14A and FIG. 14B are another series of cross-sectional views showing various processing steps to connect the power control ICs with the common-drain MOSFET wafers and to connect pinouts in examples of the present disclosure.

In block 852 and FIG. 14A, solder balls 1432 are dropped on bonding pads (not shown) at the openings on the passivation layer electrically connecting to the sources of the dual common-drain MOSFETs 1412 and 1412'. A reflow process is applied to the solder balls 1432. Block 852 may be followed by block 854. Additional solder balls may be dropped on bonding pads that are electrically isolated from the gate and source electrodes of the dual common-drain MOSFETs 1412 and 1412'.

Figure 14B:
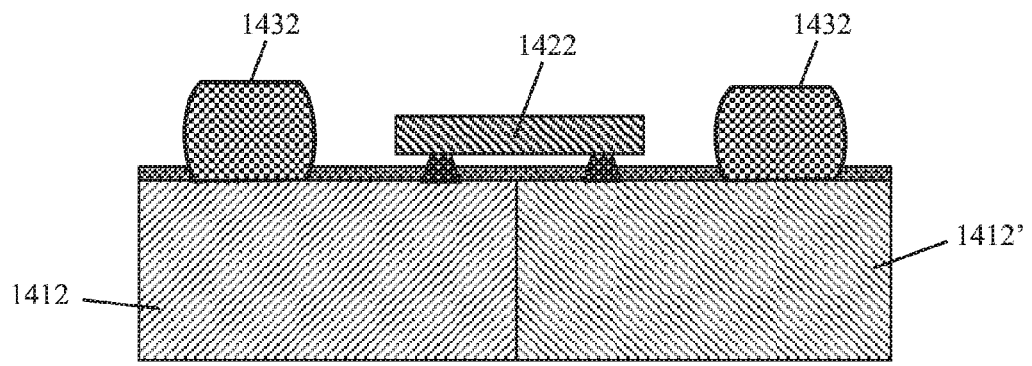

In block 854 and FIG. 14B, one power control IC 1422 is flipped and mounted on the dual common-drain MOSFETs 1412 and 1412' with solder balls 1432 formed thereon. The conductive bumps on the power control IC 1422 is electrically coupled to the gate electrodes of both MOSFETs 1412 and 1412' at the openings on the passivation layer.

Block 506 may be followed by block 508. For the purpose of simplicity, cross-section diagrams of FIG. 12A-FIG. 12F only show one power control IC mounted on a dual common-drain MOSFETs of the processed common-drain MOSFET wafer.

Figure 12A:
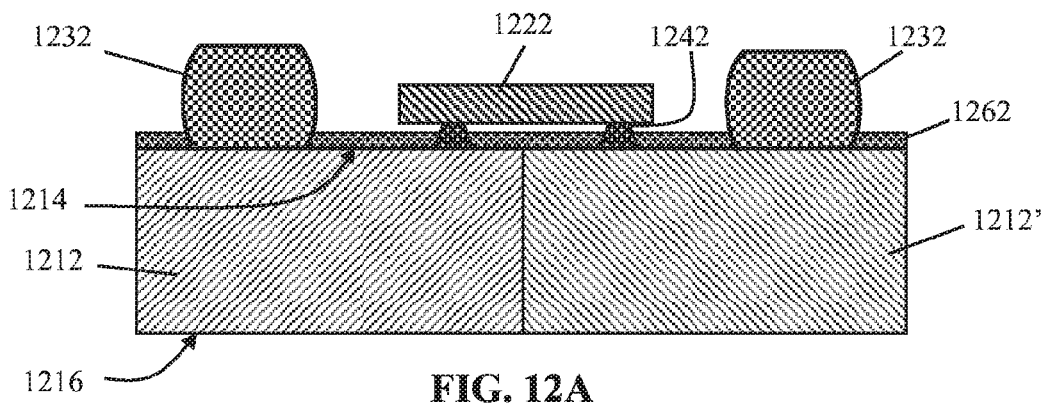
FIG. 12A-FIG. 12F and FIG. 12E-1 are a series of cross-sectional views showing various processing steps to fabricate battery protection packages in examples of the present disclosure.
Figure 12B:
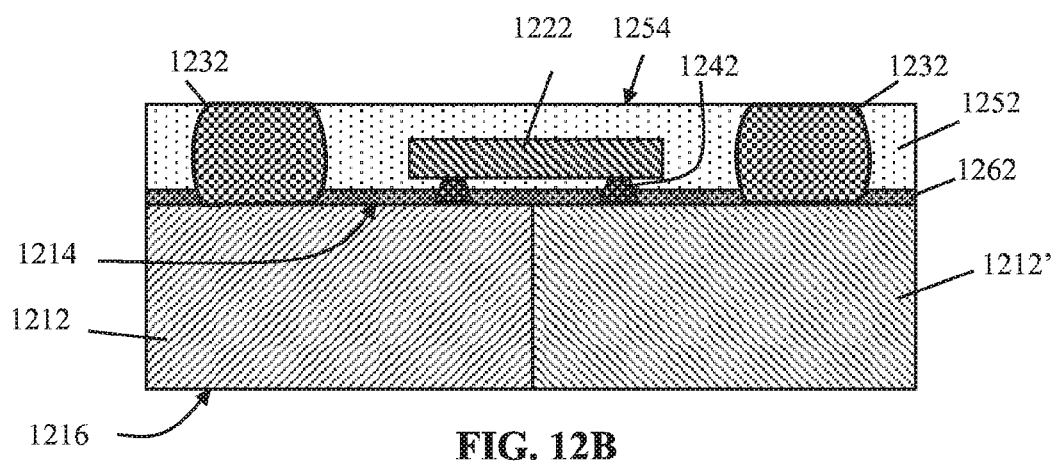

In block 508 and FIGS. 12A and 12B, a packaging layer 1252 is formed covering a power control IC 1222 flipped and mounted on the dual common-drain MOSFETs 1212 and 1212'. In FIG. 12A, the dual common-drain MOSFETs has a first surface 1214 and a second surface 1216. A passivation layer 1262 including openings is deposited on the first surface 1214 of the common-drain MOSFET wafer with bonding pads formed on the first surface 1214 of the common-drain MOSFET wafer at the openings (not shown). A plurality of conductive bumps 1242 formed at the top surface of the power control IC 1222 is attached to a first plurality of bonding pads that are formed at the first surface 1214. In one example, the first plurality of bonding pads includes at least two bonding pads that are respectively electrically connected to the gate electrodes of the common-drain MOSFETs 1212 and 1212'. In another example, the first plurality of bonding pads includes one or more bonding pads electrically connected to one or more other bonding pads electrically isolated from any gate or source electrode of the common-drain MOSFETs 1212 and 1212'. A plurality of solder balls 1232 are attached to a second plurality of bonding pads (not shown) other than the first plurality of bonding pads. In one example, the second plurality of bonding pads includes at least two bonding pads respectively electrically connecting to the source electrodes of the common-drain MOSFETs 1212 and 1212'. In another example, the second plurality of bonding pads includes one or more bonding pads electrically connected to one or more bonding pads of the first plurality of bonding pads. In yet another example, the second plurality of bonding pads includes one or more bonding pads electrically isolated from any gate or source electrode of the common-drain MOSFETs 1212 and 1212'. FIG. 12B shows the packaging layer 1252 having a first surface 1254. The power control IC 1222 and the plurality of solder balls 1232 are entirely embedded into the packaging layer 1252. Block 508 may be followed by block 510.

Figure 12C:
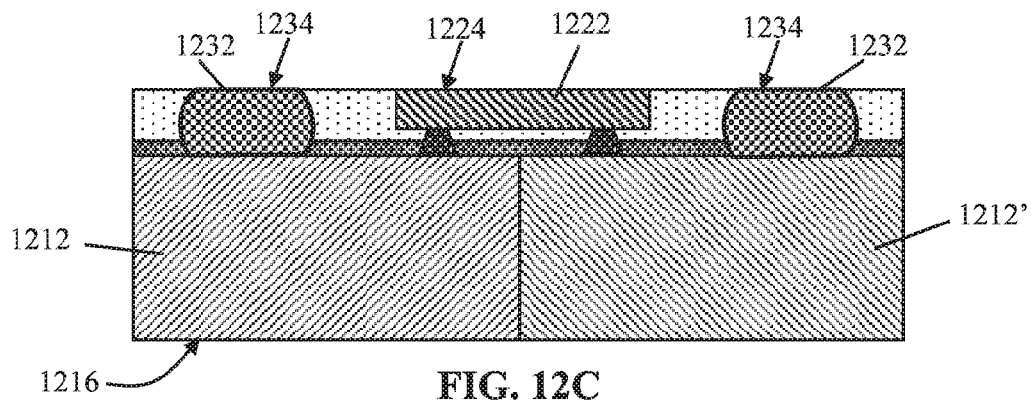

In block 510 and FIG. 12C, a grinding process is applied at the first surface 1254 of the packaging layer 1252. In FIG. 12C, the first surface 1254 of the packaging layer 1252 is ground until the top surfaces 1234 of the solder balls 1232 are exposed. In one example, a top surface 1224 of the power control IC 1222 is also exposed. In another example, the power control IC is embedded into the packaging layer (not shown). Block 510 may be followed by block 512.

Figure 12D:
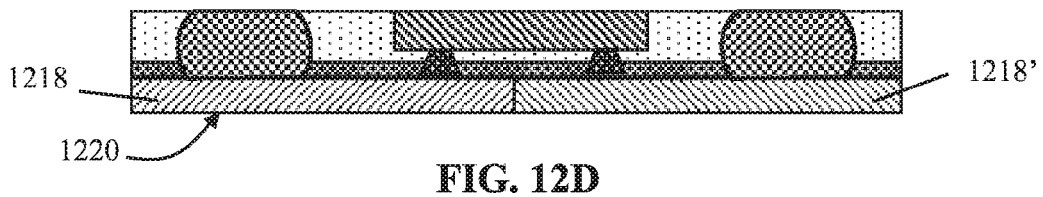

In block 512 and FIG. 12D, another grinding process is applied at the second surface 1216 of the common-drain MOSFETs 1212 and 1212'. FIG. 12D shows a thinner common-drain MOSFET wafer including dual common-drain MOSFETs 1218 and 1218' having a ground surface 1220. Block 512 may be followed by block 514.

Figure 12E:
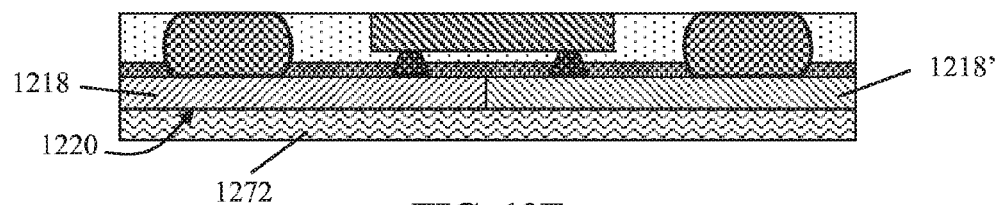

In block 514 and FIG. 12E, a metal layer 1272 is deposited on the ground surface 1220 of the thinner common-drain MOSFET wafer including dual common-drain MOSFETs 1218 and 1218'. In one example, the metal layer 1272 includes Ti/Ni/Ag with the thickness of Ag layer being about 5 microns. In another example, the metal layer 1272 is from 5 microns to 10 microns in thickness.

Figure 12F:
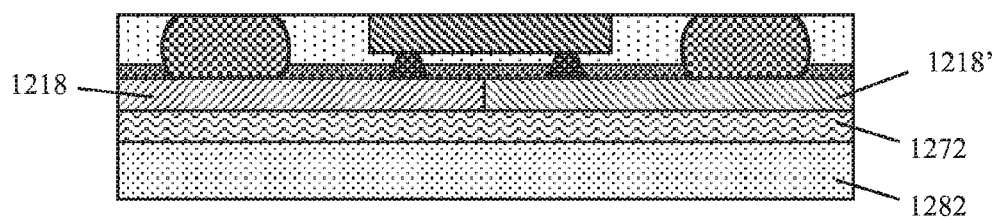

In block 516 and FIG. 12F, a molded layer 1282 is deposited on the bottom surface of the thick metal layer 1272 to support the device structure. The thickness of the molded layer 1282 maybe about 100 microns. A processed interconnected wafer is formed. Block 516 may be followed by process 900 of FIG. 9.

Figure 9:
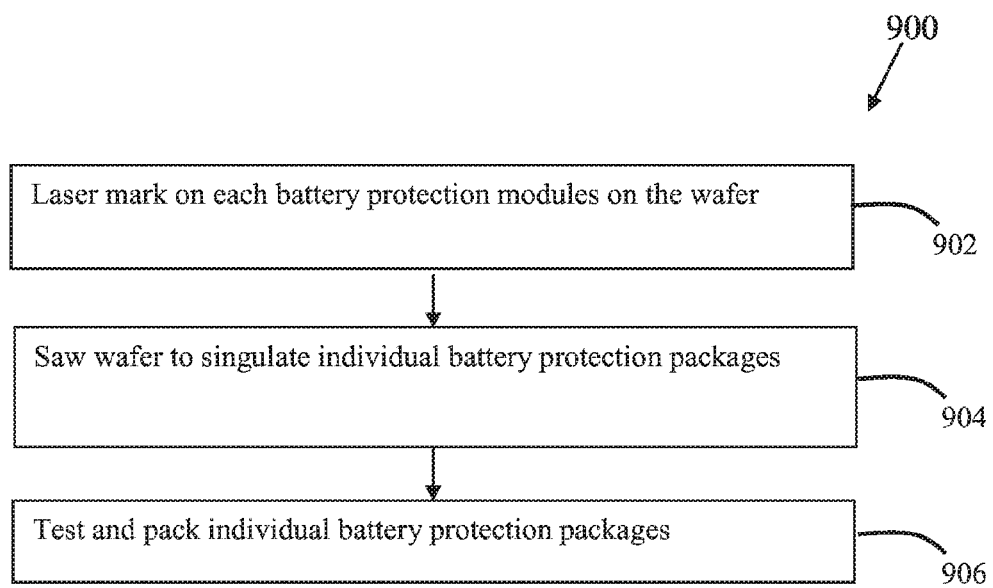
FIG. 9 is a flowchart of a process to mark, singulate, test, and pack battery protection packages in examples of the present disclosure.

FIG. 9 is a flowchart of a process 900 to laser mark, singulate, test, and pack battery protection packages in examples of the present disclosure. Block 514 of FIG. 5 may be followed by process 900.

In block 902, laser marks are added to each battery protection packages at wafer scale level. Block 902 may be followed by block 904.

In block 904, the wafer is cut to singulate the individual marked battery protection packages. Block 904 may be followed by block 906.

In block 906, the individual marked battery protection packages are tested. Each of the battery protection packages has a passed status is then packed thus forming a battery protection packages 100 and 200 of FIG. 1B or FIG. 2B.

Figure 5B:
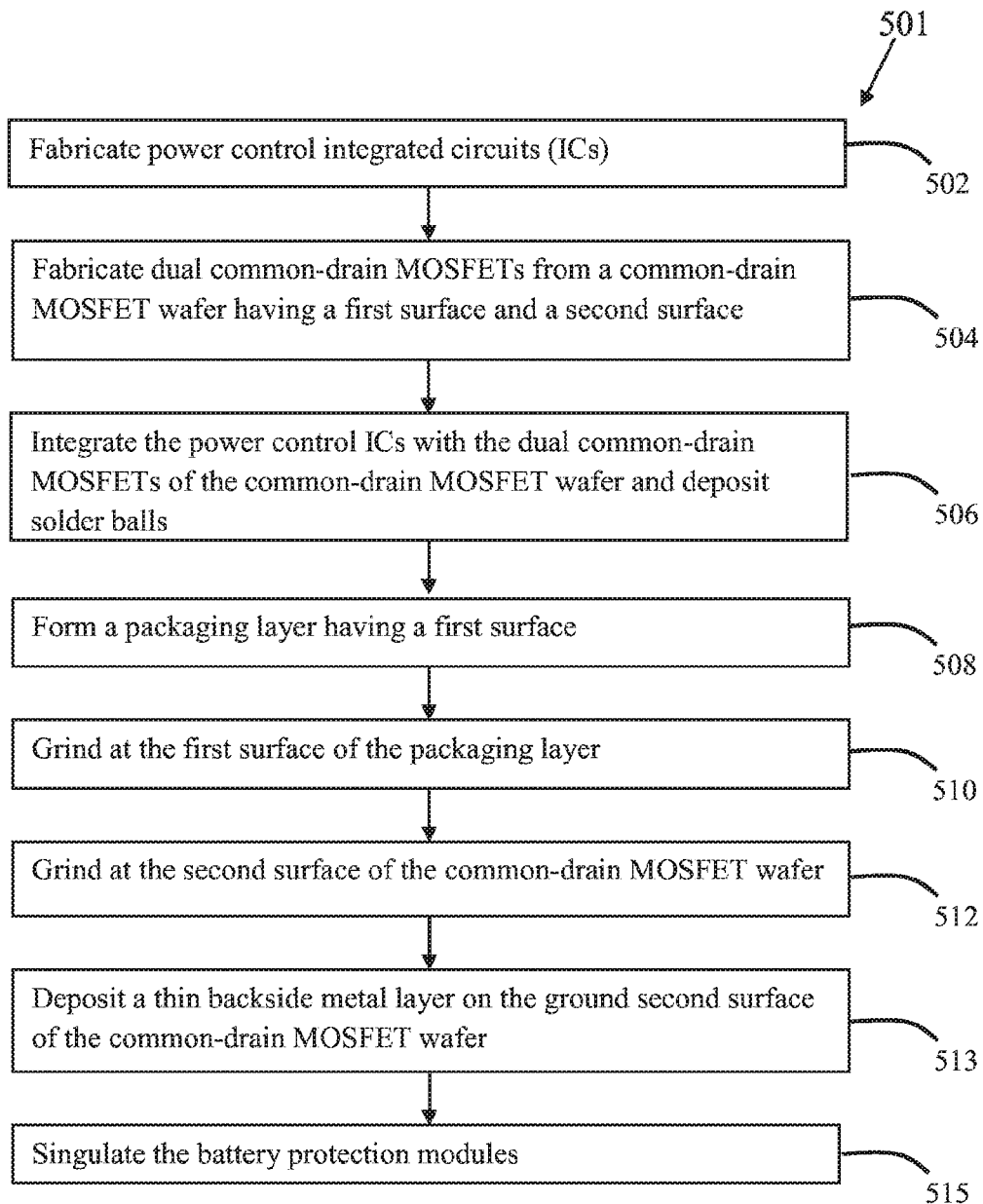

FIG. 5B is a flowchart of a process 501 to fabricate the battery protection packages 300 and 301 of FIG. 3B and FIG. 3D. The steps of blocks 502 to 512 are exactly the same as those in process 500 of FIG. 5A. Block 512 may be followed by block 513.

Figures 1, 12E:
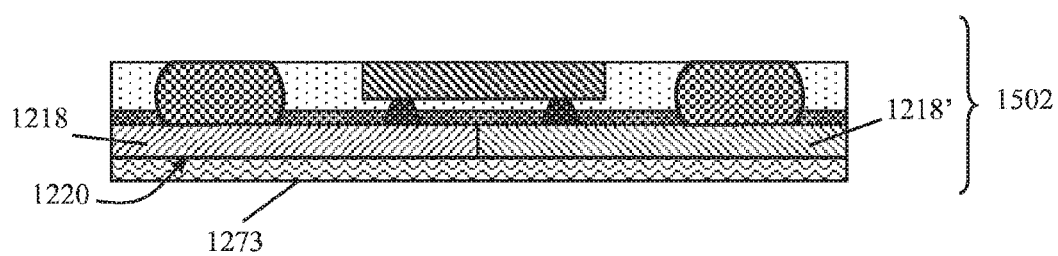

In block 513 and FIG. 12E-1, a metal layer 1273 is deposited on the ground surface 1220 of the thinned common-drain MOSFET wafer including dual common-drain MOSFETs 1218 and 1218'. In examples of the present disclosure, a metal layer 1273 is deposited on the ground surface 1220 of the thinner common-drain MOSFET wafer. In one example, the metal layer 1273 is about 1 micron in thickness. A processed interconnected wafer is formed. Block 513 may be followed by block 515.

In block 515, battery protection modules are singulated from the processed interconnected wafer. Block 516 may be followed by process 1000 of FIG. 10.

Figure 10:
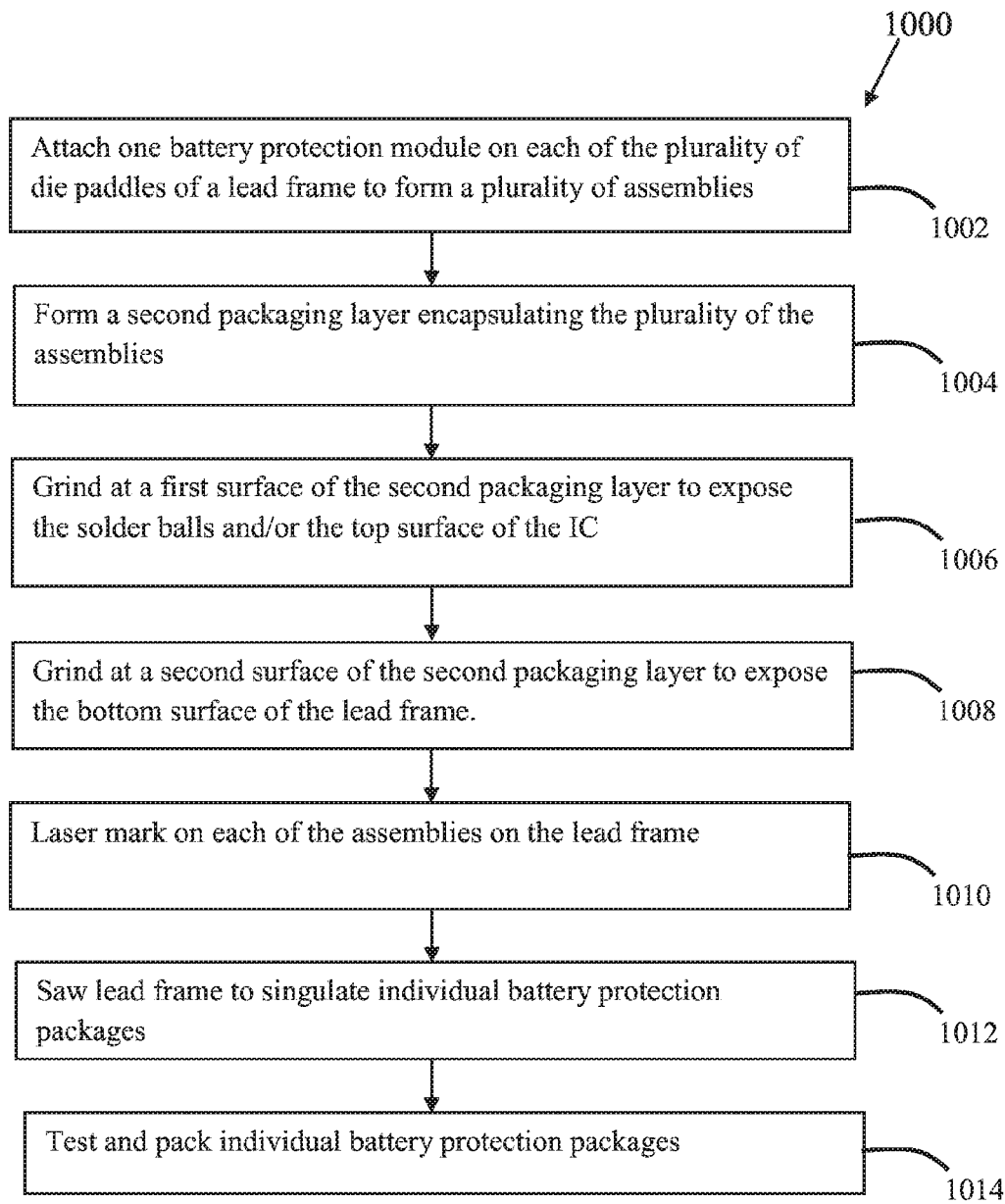
FIG. 10 is a flowchart of a process to package battery protection packages in examples of the present disclosure.

FIG. 10 is a flowchart of a process 1000 to package battery protection modules in examples of the present disclosure. Block 516 of FIG. 5B may be followed by process 1000. Process 1000 may begin in block 1002.

Figure 15A:
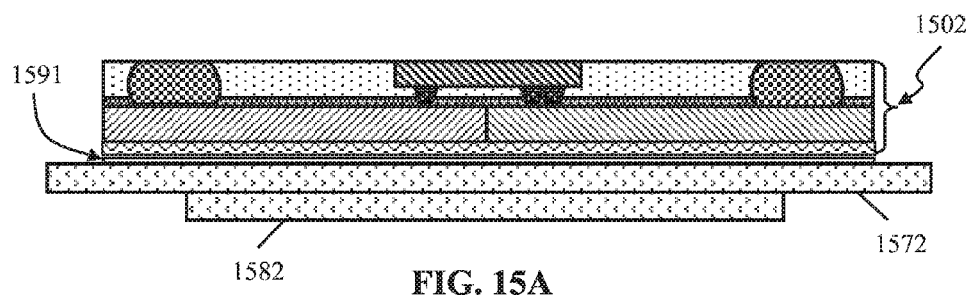
FIG. 15A-FIG. 15D are a series of cross-sectional views showing various processing steps to fabricate battery protection packages in examples of the present disclosure.

In block 1002 and FIG. 15A, each of battery protection modules 1502 of FIG. 12E-1 after singulated from the wafer is attached to each of the plurality of die paddle 1572 of a lead frame 1582 via a silver epoxy layer 1591 so as to form a plurality assemblies. Block 1002 may be followed by block 1004.

Figure 15B:
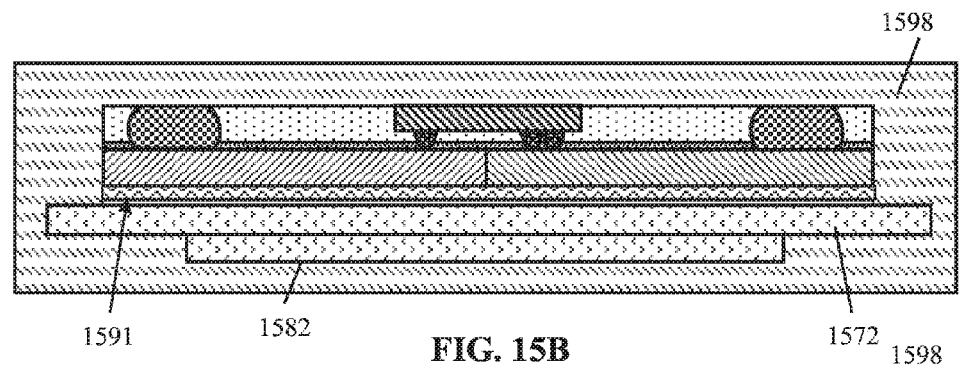

In block 1004 and FIG. 15B, a second packaging layer 1598 is formed on each of the assemblies. Block 1004 may be followed by block 1006.

Figure 15C:
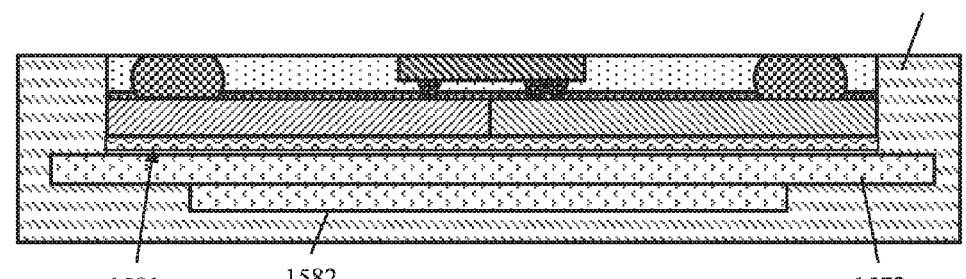

In block 1006 and FIG. 15C, a grinding process is applied at a first surface of the packaging layer to expose the solder balls and/or the ICs. Block 1006 may be followed by block 1008.

Figure 15D:
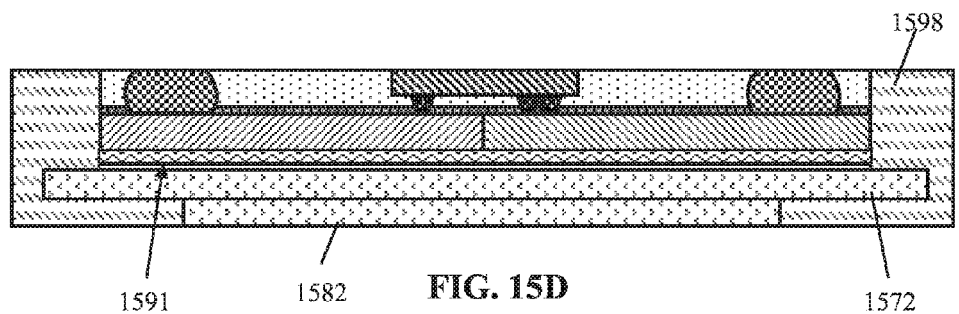

In block 1008 and FIG. 15D, another grinding process is applied at a second surface of the second packaging layer to expose the bottom surface of the lead frame.

In block 1010, laser marks are added to each battery protection packages on the lead frame. Block 1010 may be followed by block 1012.

In block 1012, the lead frame is cut to singulate the individual marked battery protection packages. Block 1012 may be followed by block 1014.

In block 1014, the individual marked battery protection packages are tested. Each of the battery protection packages that has a passed status is then packed thus forming a battery protection packages 300 and 301 of FIG. 3B or FIG. 3D.

Those of ordinary skill in the art may recognize that modifications of the embodiments disclosed herein are possible. For example, the thickness of the metal layer 1272 of FIG. 12E may vary. For example, the number of pinouts in a layout design may vary. Other modifications may occur to those of ordinary skill in this art, and all such modifications are deemed to fall within the purview of the present invention, as defined by the claims.

The invention claimed is:

1. A process for fabricating battery protection packages, the process comprising the steps of:
fabricating power control integrated circuits (ICs), the step of fabricating power control ICs comprising the sub-steps of:
providing a power control IC wafer having a first surface and a second surface opposing the first surface of the power control IC;
forming conductive bumps on the first surface of the power control IC wafer;
thinning the power control IC wafer by grinding at the second surface of the power control IC wafer; and
singulating the power control ICs from the power control IC wafer;
fabricating common-drain metal oxide semiconductor field effect transistors (MOSFETs), the step of fabricating common-drain MOSFETs comprising the sub-steps of:
providing a common-drain MOSFET wafer having a first surface and a second surface opposing the first surface of the common-drain MOSFET wafer;
forming a first passivation layer on the first surface of the common-drain MOSFET wafer;
removing part of the passivation layer so as to expose metal lines; and
forming a second passivation layer;
integrating the power control ICs with the common-drain MOSFET wafer and connecting pinouts so as to form an interconnected wafer;
forming a packaging layer on the interconnected wafer, the packaging layer having a first surface;
grinding at the first surface of the packaging layer;
grinding at the second surface of the common-drain MOSFET wafer;
depositing a metal layer on the ground second surface of the common-drain MOSFET wafer so as to form a processed interconnected wafer; and
singulating the battery protection packages from the processed interconnected wafer.

2. The process of claim 1, wherein the step of integrating the power control ICs with the common-drain MOSFET wafer and connecting pinouts comprises:
flipping and mounting the power control ICs on the common-drain MOSFET wafer; and
dropping and reflowing solder balls so as to form the connected pinouts.

3. The process of claim 1, wherein the step of integrating the power control ICs with the common-drain MOSFET wafer and connecting pinouts comprises:
dropping and reflowing solder balls so as to form the connected pinouts; and
flipping and mounting the power control ICs on the common-drain MOSFET wafer.

4. The process of claim 3, wherein the power control ICs and the solder balls are exposed after the step of grinding at the first surface of the packaging layer.

5. The process of claim 3, wherein the solder balls are exposed after the step of grinding at the first surface of the packaging layer.

6. The process of claim 1, further comprising:
after the sub-step of removing part of the passivation layer, depositing a redistribution layer.

7. The method of claim 1, further comprising:
after the step of depositing a metal layer on the ground second surface of the common-drain MOSFET wafer and before the step of singulating the battery protection packages from the processed interconnected wafer, laser-marking on the battery protection packages; and
after the step of singulating the battery protection packages from the processed interconnected wafer, testing of the battery protection packages; and
packing of battery protection packages.

8. The method of claim 1, further comprising:
after the step of singulating the battery protection package from the processed interconnected wafer,
attaching the battery protection packages to die paddles of a lead frame so as to form assemblies;
forming an external packaging layer on each of the assemblies, the external packaging layer having a first surface and a second surface opposing the first surface;
grinding at the first surface of the external packaging layer on each of the assemblies;
grinding at the second surface of the external packaging layer on each of the assemblies so as to form a plurality of dual-packaged battery protection packages;
laser-marking on the plurality of dual-packaged battery protection packages;
singulating each of the plurality of dual-packaged battery protection packages by cutting the lead frame;
testing of the plurality of dual-packaged battery protection packages; and
packing of the plurality of dual-packaged battery protection packages.

9. The method of claim 1, further comprising:
after the step of depositing a metal layer on the ground second surface of the common-drain MOSFET wafer and before the step of singulating the battery protection packages from the processed interconnected wafer,
depositing a backside molded layer on a bottom surface of the metal layer.

* * * * *